(12) United States Patent
Chen et al.

(10) Patent No.: US 11,166,393 B1
(45) Date of Patent: Nov. 2, 2021

(54) STORAGE DEVICE AND AN ARRAY OF DISKS, AND AN APPARATUS FOR ARRANGING DISK

(71) Applicant: EMC IP Holding Company LLC, Hopkinton, MA (US)

(72) Inventors: Zhao Chen, Shanghai (CN); Huwei Di, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/989,090

(22) Filed: Aug. 10, 2020

(30) Foreign Application Priority Data

Apr. 30, 2020 (CN) .......................... 202010364429.4

(51) Int. Cl.
*G06F 1/16* (2006.01)
*H05K 5/00* (2006.01)
*H05K 7/00* (2006.01)
*H05K 7/14* (2006.01)
*H05K 7/20* (2006.01)

(52) U.S. Cl.
CPC ......... *H05K 7/1489* (2013.01); *H05K 7/1415* (2013.01); *H05K 7/20127* (2013.01)

(58) Field of Classification Search
CPC ............. H05K 7/1415; H05K 7/20127; H05K 7/1485; G06F 1/187
See application file for complete search history.

(56) References Cited

U.S. PATENT DOCUMENTS

| | | | |
|---|---|---|---|
| 9,603,280 B2 | 3/2017 | Frank et al. | |
| 9,668,371 B1 * | 5/2017 | Strmiska | H05K 7/1489 |
| 9,775,262 B1 * | 9/2017 | Hsieh | H05K 7/1489 |
| 9,857,851 B1 * | 1/2018 | Van Pelt | H05K 7/1489 |
| 9,910,466 B1 | 3/2018 | Strickland et al. | |
| 9,999,154 B2 | 6/2018 | Frank et al. | |
| 10,080,300 B1 | 9/2018 | Olesiewicz et al. | |
| 10,874,027 B2 | 12/2020 | Marrs et al. | |
| 10,939,573 B1 * | 3/2021 | Liao | H05K 7/1409 |
| 2016/0165743 A1 * | 6/2016 | Milligan | H05K 7/1489 361/679.31 |
| 2017/0147042 A1 * | 5/2017 | Liu | G11B 33/02 |
| 2018/0210518 A1 * | 7/2018 | Lu | G11B 33/124 |
| 2019/0075666 A1 * | 3/2019 | Ehlen | H05K 5/0239 |

* cited by examiner

*Primary Examiner* — Anthony M Haughton
(74) *Attorney, Agent, or Firm* — BainwoodHuang (57) ABSTRACT

Techniques arrange a disk, a storage device, and a disk array. Such techniques involve: a bracket configured to be detachably coupled to a rack; and a button arranged in the bracket and configured to be movable under the action of an external force to decouple the bracket from the rack, wherein a first end of the button is configured to be operated by a user, and the end surface of the first end includes a first surface and a second surface, the second surface extending from the first surface towards a second end, opposite to the first end, of the button. Accordingly, such techniques not only can avoid accidental touch, improve heat dissipation efficiency, and provide a mark area, but also can help prevent loss of user data in a storage device and a disk array.

12 Claims, 5 Drawing Sheets

STORAGE DEVICE AND AN ARRAY OF DISKS, AND AN APPARATUS FOR ARRANGING DISK

CROSS-REFERENCE TO RELATED APPLICATION

This application claims priority to Chinese Patent Application No. CN202010364429.4 on file at the China National Intellectual Property Administration (CNIPA), having a filing date of Apr. 30, 2020, and having "A STORAGE DEVICE AND AN ARRAY OF DISKS, AND AN APPARATUS FOR ARRANGING DISK" as a title, the contents and teachings of which are herein incorporated by reference in their entirety.

TECHNICAL FIELD

Embodiments of the present disclosure generally relate to the field of data storage, and in particular, to an apparatus for arranging a disk, a storage device, and a disk array.

BACKGROUND

A high-density storage server is usually of a modular design and has a drive cabinet and a disk drive array. Disk drives use an industry-standard dimension, and server cabinets are also usually standardized in terms of their dimensions. For example, disk drives of a narrower width (e.g., a width of 7.6 mm) are defined in the new Enterprise and Datacenter SSD Form Factor (EDSFF), and when the disk drives are mounted into a cabinet, the spacing between adjacent disk drives is only 1.9 mm.

A decrease in the dimension of disk drives will affect heat dissipation and reduce the available mark area (e.g., for marking parameter information of a disk drive). While an increase in the number of disk drives in the available space will cause compression or reduction of the space between the drives (e.g., being 1.9 mm only), which makes it very easy for a user to accidentally touch other disk drives when dismounting a certain disk drive, resulting in forced turn-off of the disk drives and corruption or loss of data in a storage server.

SUMMARY OF THE INVENTION

According to an embodiment of the present disclosure, a solution related to a disk drive and a storage server that conform to a new-generation Enterprise and Datacenter SSD Form Factor is provided.

In a first aspect of the present disclosure, an apparatus for arranging a disk is provided. The apparatus includes: a bracket configured to be detachably coupled to a rack; and a button arranged in the bracket and configured to be movable under the action of an external force to decouple the bracket from the rack, wherein a first end of the button is configured to be operated by a user, and the end surface of the first end includes a first surface and a second surface, the second surface extending from the first surface towards a second end, opposite to the first end, of the button.

According to an embodiment of the present disclosure, the button has a first surface and a second surface. By providing the second surface, the apparatus provides a user with more operation space, thereby preventing the user from accidentally touching other buttons when touching a button (e.g., when dismounting the apparatus and the disk).

In some embodiments, the first surface is a flat surface and the second surface is an inclined surface or a curved surface. Providing the second surface as an inclined surface or a curved surface can simplify the manufacturing process of the button and reduce costs.

In some embodiments, the surface area of the second surface is greater than that of the first surface. Therefore, the apparatus provides a user with more operation space, particularly in the case where a disk array is formed, and there is more operation space between adjacent buttons, which can prevent the user from accidentally touching other buttons.

In some embodiments, a touch location identifier is arranged on the first surface, and the first surface is adapted to be touched by a user so as to move the button. The touch location identifier provided on the first surface helps the user to find a predetermined touch location on the button.

In some embodiments, the bracket further includes: a connecting end configured to connect the disk; and a lever configured to be detachably coupled to the rack, wherein the button is arranged at an operating end, opposite to the connecting end, of the bracket. Therefore, a simplified coupling structure between the bracket and the rack is provided, and the bracket can be easily mounted on or dismounted from the rack.

In some embodiments, the lever is pivotably mounted to the bracket via a rotating shaft and includes a first hook portion and a first groove respectively arranged at two ends of the lever, and the first hook portion is detachably coupled to the rack; and the apparatus further includes a trigger element pivotably mounted to the bracket via a pivot, and the trigger element includes a pressing end coupled with the button and a locking end adapted to be coupled with the first groove, wherein the pressing end is configured to rotate the trigger element about the pivot in response to the movement of the button under the action of an external force, so as to decouple the locking end from the first groove, thereby allowing the first hook portion of the lever to disengage from the rack. A simple bracket and button structure is provided, and the mounting and dismounting processes of the bracket on the rack are improved.

In some embodiments, the end surface of the operating end includes a third surface and a fourth surface that extends from the third surface towards the connecting end. Providing a third surface and a fourth surface at the operating end of the bracket can increase the available surface area of the operating end.

In some embodiments, a ventilation hole is arranged on the third surface, and the ventilation hole is configured to allow the air to flow through so as to cool the disk, and at least capacity information of the disk is provided on the fourth surface. Since the operating end has an increased available surface area, a ventilation hole can be more reasonably arranged on the bracket to improve the heat dissipation efficiency, and information, for example, of a large font size and/or in more detail may be provided on the bracket.

In some embodiments, the third surface is parallel to the first surface, and the fourth surface is an inclined surface or a curved surface. Therefore, the structure of the apparatus is simplified, and the cost is reduced.

In a second aspect of the present disclosure, a storage device is provided. The storage device includes: the apparatus according to the first aspect of the present disclosure; and a disk coupled to the bracket.

According to the second aspect of the present disclosure, the storage device provides a user with more operation space, which can prevent the user from accidentally touching buttons of other storage devices when touching a button (e.g., dismounting), thereby preventing data from being corrupted or lost.

In a third aspect of the present disclosure, a disk array is provided. The disk array includes: a rack on which a plurality of storage devices, including the storage device according to the second aspect of the present disclosure, are arranged side by side, wherein first surfaces and second surfaces of buttons of adjacent storage devices are alternately arranged in the arrangement direction (X) of the plurality of storage devices.

The storage devices provide a user with more operation space, which can prevent the user from accidentally touching buttons of other disks when touching a button (e.g., dismounting a disk), and therefore, the storage devices of the disk array can be prevented from being dismounted due to accidental touch. A disk array that can prevent data from being corrupted or lost is provided.

Various embodiments of the present disclosure have been described above. The foregoing description is illustrative rather than exhaustive, and is not limited to the disclosed various embodiments. Numerous modifications and changes are apparent to those of ordinary skill in the art without departing from the scope and spirit of the illustrated various embodiments. The selection of terms as used herein is intended to best explain the principles and practical applications of the various embodiments or the improvements to technologies on the market, or to enable other persons of ordinary skill in the art to understand the embodiments disclosed herein.

It should be understood that the content described in the summary part is neither intended to limit key or essential features of the embodiments of the present disclosure, nor intended to limit the scope of the present disclosure. Other features of the present disclosure will become readily understood from the following description.

BRIEF DESCRIPTION OF THE DRAWINGS

The above-mentioned and other features, advantages, and aspects of the embodiments of the present disclosure will become more apparent with reference to the accompanying drawings and the following detailed description. In the accompanying drawings, identical or similar reference numerals represent identical or similar elements, in which.

In the accompanying drawings, identical or corresponding reference numerals represent identical or corresponding parts.

DETAILED DESCRIPTION

The individual features of the various embodiments, examples, and implementations disclosed within this document can be combined in any desired manner that makes technological sense.

Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document.

It should be understood that the specialized circuitry that performs one or more of the various operations disclosed herein may be formed by one or more processors operating in accordance with specialized instructions persistently stored in memory. Such components may be arranged in a variety of ways such as tightly coupled with each other (e.g., where the components electronically communicate over a computer bus), distributed among different locations (e.g., where the components electronically communicate over a computer network), combinations thereof, and so on.

Preferred embodiments of the present disclosure will be described in more detail below with reference to the accompanying drawings. Preferred embodiments of the present disclosure are shown in the accompanying drawings. However, it should be understood that the present disclosure may be implemented in various forms and should not be limited by the embodiments described here. Instead, the embodiments are provided to make the present disclosure more thorough and complete and to fully convey the scope of the present disclosure to those skilled in the art.

The term "include" and its variants as used herein indicate open inclusion, i.e., "including, but not limited to." Unless specifically stated, the term "or" indicates "and/or." The term "based on" indicates "based at least in part on." The terms "an example embodiment" and "an embodiment" indicate "at least one example embodiment." The term "another embodiment" indicates "at least one additional embodiment." The terms "first," "second," and the like may refer to different or identical objects. Other explicit and implicit definitions may also be included below.

Figure 1:
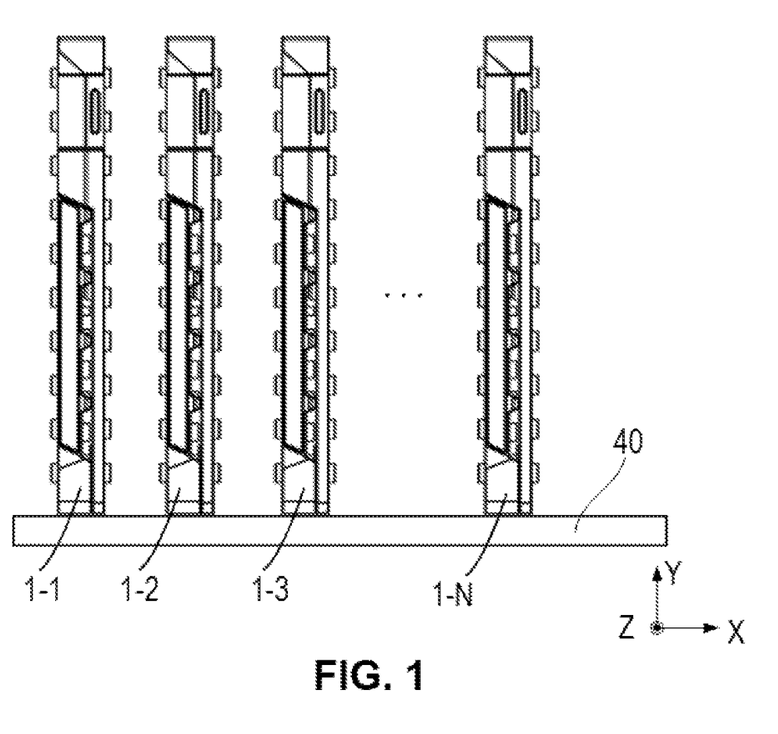
FIG. 1 illustrates a schematic diagram of a disk array according to some embodiments of the present disclosure.

FIG. 1 illustrates a schematic diagram of a disk array of an embodiment of the present disclosure. Under the new Enterprise and Datacenter SSD Form Factor specification, storage device 1 is narrower in the X direction (e.g., with a width of 7.6 mm), and the spacing between adjacent storage devices 1 is only 1.9 mm. Therefore, a new apparatus for arranging a disk, a storage device, and a disk array are needed to prevent other storage devices from being dismounted due to accidental touch, and to improve the heat dissipation efficiency and provide a larger mark area for the storage device.

According to an embodiment of the first aspect of the present disclosure, the apparatus for arranging disk 30 includes bracket 10 and button 20, in which bracket 10 is configured to be detachably coupled to rack 40.

"Disk" described here may refer to any non-volatile storage medium currently known or to be developed in the future, such as a magnetic disk, an optical disk, or a solid state disk (SSD).

In some embodiments, bracket 10 may include lever 106. Lever 106 is detachably coupled to rack 40 so that bracket 10 may be mounted to rack 40 or removed from rack 40.

Figure 2:
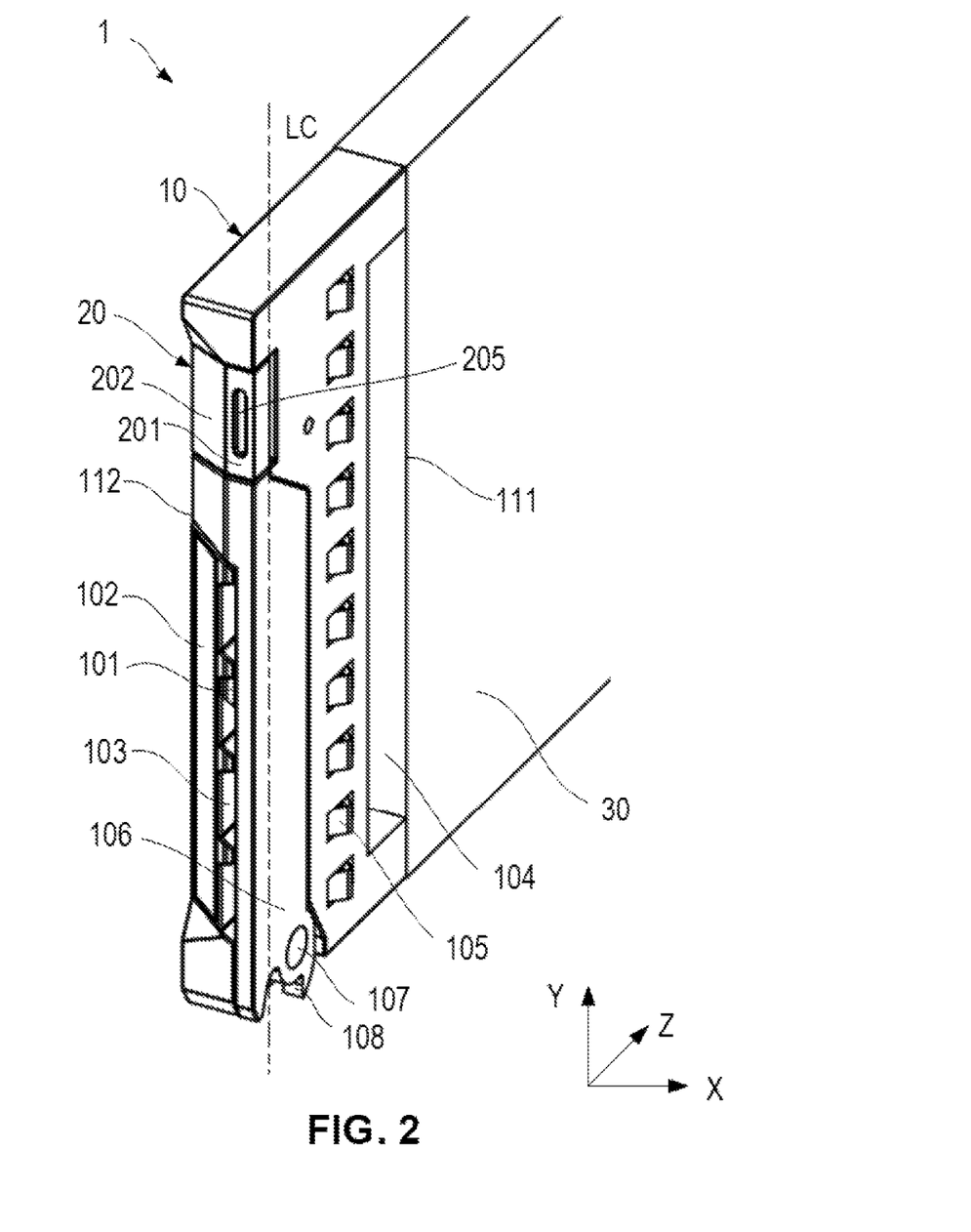
FIG. 2 illustrates a stereogram of a storage device according to some embodiments of the present disclosure, in which an apparatus for arranging a disk is mainly illustrated.
Figure 3:
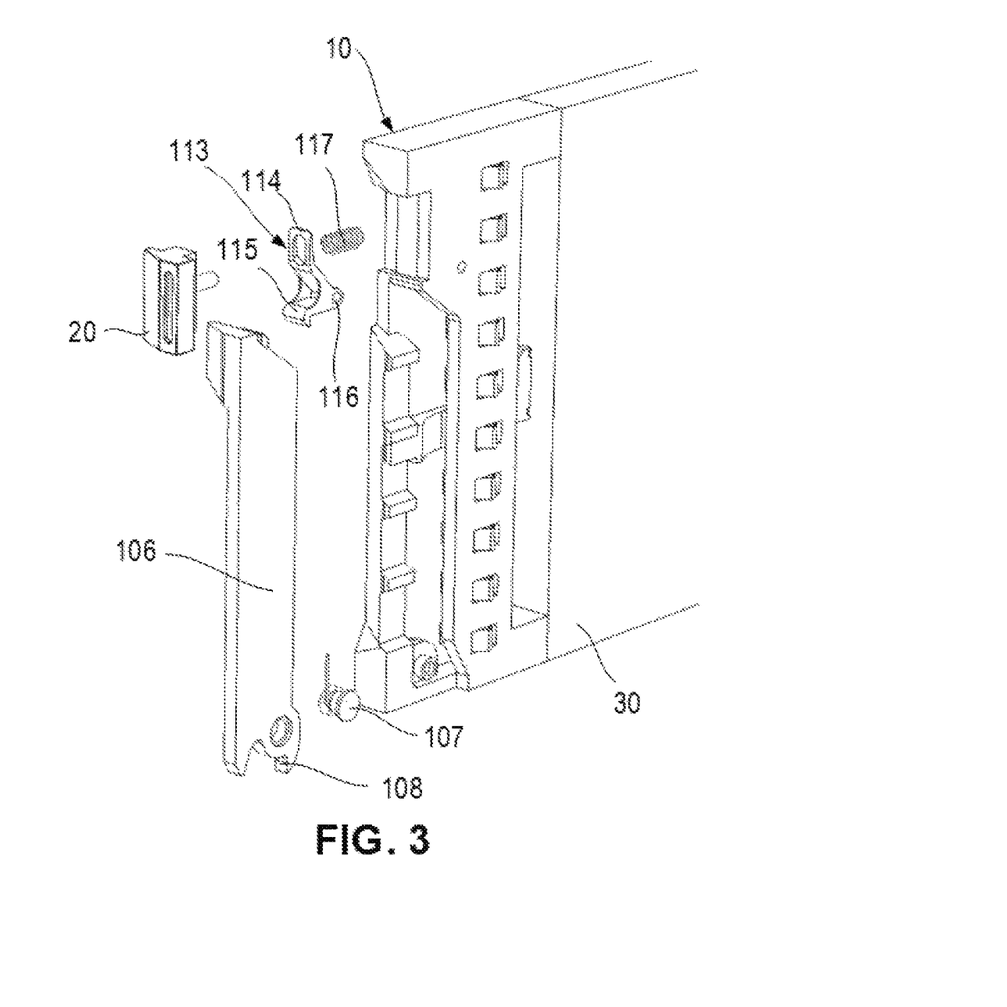
FIG. 3 illustrates a stereogram of a storage device according to some embodiments of the present disclosure, in which an apparatus for arranging a disk is mainly illustrated.

In some embodiments, as shown in FIGS. 2 and 3, lever 106 may be pivotably mounted to bracket 10 via rotating shaft 107, and lever 406 includes first hook portion 108 and a first groove respectively arranged at two opposite ends thereof. Therefore, a simplified coupling structure between bracket 10 and rack 40 is provided, and bracket 10 can be easily mounted on or dismounted from rack 40.

First hook portion 108 of lever 106 may be coupled with a corresponding groove on rack 40 to fix bracket 10 onto rack 40, and may also disengage from the corresponding groove to remove bracket 10 from rack 40. In other words, first hook portion 108 is detachably coupled to rack 40.

The first groove of lever 106 may be adapted to be coupled with locking end 115 of trigger element 113, as shown in FIG. 3. Trigger element 113 is pivotably mounted to bracket 10 via pivot 116, and trigger element 113 includes pressing end 114 coupled with button 20 and locking end 115 adapted to be coupled with the first groove.

Therefore, if pressing end 114 moves, for example, with the movement of button 20, trigger element 113 will pivot about pivot 116, thereby causing locking end 115 to disengage from the first groove of lever 106. In this case, lever 106 may pivot about rotating shaft 107, for example, by the torsional force of a torsion spring at rotating shaft 107 or by a user's pulling, so as to decouple first hook portion 108 from rack 40.

In some embodiments, the apparatus for arranging disk 30 may further include resilient biasing member 117 (e.g., a spiral spring) which is configured to abut against and bias trigger element 113 to cause locking end 115 thereof to tend to lock the first groove. It should be understood that if button 20 is touched and moved by a user, the movement of button 20 will resist the biasing force of resilient biasing member 117 to pivot trigger element 113 and decouple locking end 115 from the first groove.

In some embodiments, pivot 116 may be arranged between pressing end 114 and locking end 115 of trigger element 113. It should be understood that the embodiments of the present disclosure do not limit the specific structure of trigger element 113, as long as pressing end 114 thereof can rotate trigger element 113 about pivot 116 in response to the movement of button 20. For example, trigger element 113 may have a V-shaped structure as shown in FIG. 3 or may have a straight lever structure.

In some embodiments, connecting end 111 of bracket 10 may be connected to disk 30 such that disk 30 is fixed onto bracket 10. Therefore, disk 30 may be detachably coupled to rack 40 via bracket 10.

Figure 4:
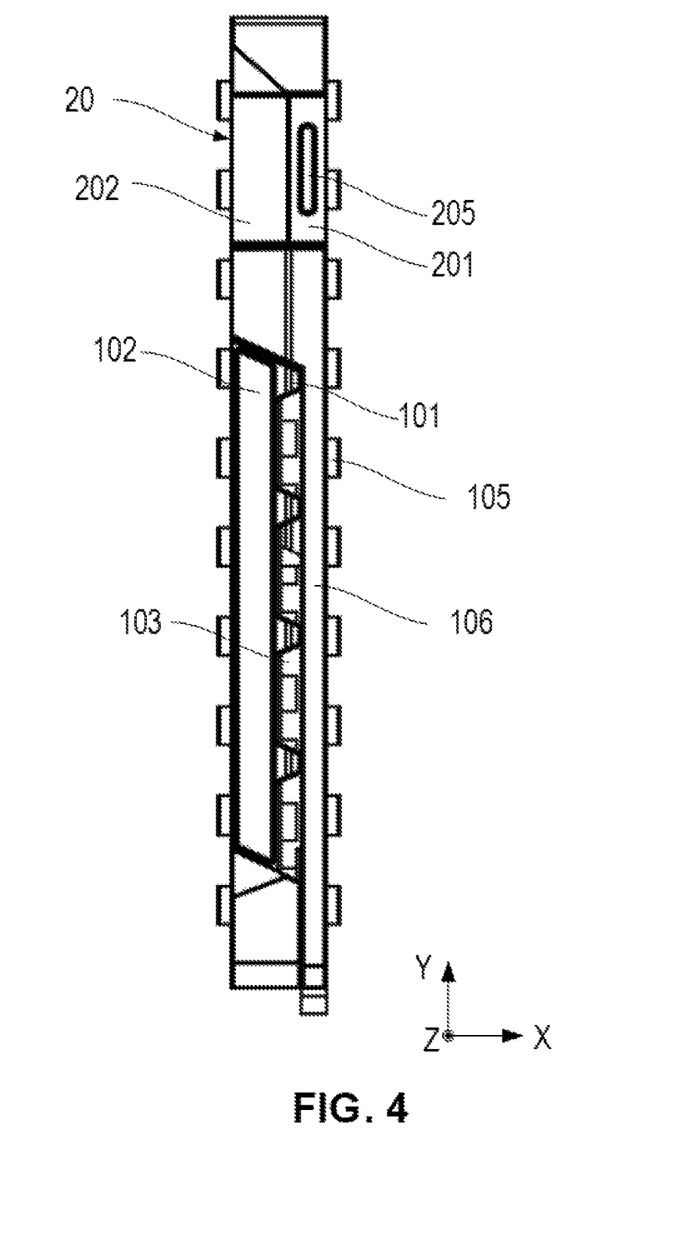
FIG. 4 illustrates a side view of an apparatus for arranging a disk according to some embodiments of the present disclosure.

In some embodiments, bracket 10 may further include operating end 112 opposite to connecting end 111. In some embodiments, as shown in FIGS. 2 and 4, the end surface of operating end 112 includes third surface 101 and a fourth surface that extends from third surface 101 towards connecting end 111. Compared with operating end 112 which has only an end surface of a flat surface form, providing a fourth surface at the operating end of the bracket can increase the available surface area of the operating end.

In some embodiments, the surface area of fourth surface 102 may be greater than that of third surface 101. For example, the surface area of fourth surface 102 is 1.1 to 2 times that of third surface 101. In other embodiments, the surface area of fourth surface 102 is 1.1 to 1.5 times that of third surface 101 in consideration of the cooling efficiency. The increased available surface area of operating end 112 can, for example, balance the needs for ventilation and marking information (to be described below).

In some embodiments, as shown in FIGS. 2 and 4, in a plane, parallel to the XY plane, where third surface 101 is located, the dimension of fourth surface 102 in the longitudinal axis LC (parallel to the Y direction) may be greater than the dimension thereof in the direction perpendicular to the longitudinal axis LC (in the X direction). Therefore, the end surface of bracket 10 can be more fully used to, for example, arrange a ventilation hole and mark information.

In some embodiments, ventilation hole 103 may be arranged on third surface 101. There may be one or a plurality of alternately arranged ventilation holes 103. The latter is shown in FIGS. 2 to 4.

Therefore, by means of ventilation hole 103, the air may flow through bracket 10 and flow out from air outlet 104 to cool disk 30. Since the operating end has an increased available surface area, a ventilation hole can be more reasonably arranged on the bracket to improve the heat dissipation efficiency.

In some embodiments, at least capacity information of disk 30 may be provided on fourth surface 102. For example, other parameters, such as the type of disk 30, may also be provided on fourth surface 102. Since the operating end has an increased available surface area, information, for example, of a larger font size and/or in more detail may be provided on the bracket. Due to the increased available surface area of operating end 112, the storage device may have a greater degree of design freedom in terms of ventilation and marking information.

As shown in FIGS. 2 to 4, button 20 is arranged in bracket 10, and button 20 is adapted to move under the action of an external force (e.g., touched by a user) to decouple bracket 10 from rack 40.

In some embodiments, button 20 may be arranged on operating end 112 of bracket 10, and when bracket 10 or storage device 1 is desired to be dismounted, the user may press button 20 to move the bracket or the storage device in the Z direction. In some embodiments, second end 212 of button 20 may abut against pressing end 114 of trigger element 113, and as previously described, if button 20 is touched by the user in the Z direction, trigger element 113 will release lever 106, thereby decoupling first hook portion 108 of lever 106 from rack 40. Therefore, the user can dismount bracket 10 or storage device 1.

Figure 5:
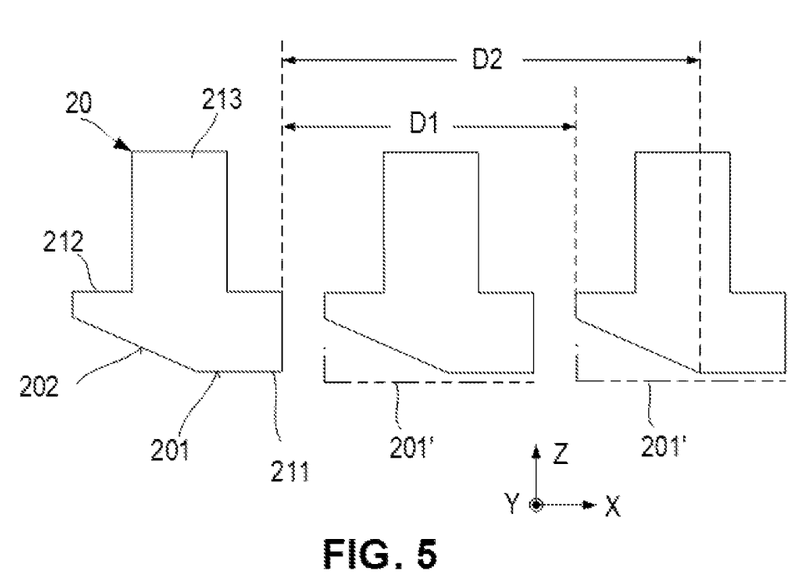
FIG. 5 illustrates a top view of a button of an apparatus for arranging a disk according to some embodiments of the present disclosure.

FIG. 5 illustrates a top view of a button of an apparatus for arranging a disk according to the an embodiment of the present disclosure. Button 20 includes first end 211 operated by a user and second end 212 opposite to first end 211, and the end surface of first end 211 includes first surface 201 and second surface 202, second surface 202 extending from first surface 201 towards second end 212.

By providing a second surface, the apparatus for arranging a disk provides the user with more operation space, thereby preventing the user from accidentally touching other buttons when touching a button (e.g., when dismounting the apparatus and the disk).

In some embodiments, first surface 201 may be a flat surface, and second surface 202 may be an inclined surface or a curved surface. Providing second surface 202 as an inclined surface or a curved surface can simplify the manufacturing process of the button and reduce costs.

In some embodiments, second end 212 of button 20 may also be provided with guide post 213 for guiding. Guide post 213 may guide the movement of button 20.

In some embodiments, the surface area of second surface 202 may be greater than that of first surface 201. Therefore, the user may have more operation space. Moreover, in the case where a disk array is formed, more operation space between adjacent buttons can prevent the user from accidentally touching other buttons. Alternatively, the surface area of second surface 202 may be 1.1 to 2 times (such as 1.1 to 1.5 times) that of first surface 201. In some embodiments, the projected area of second surface 202 in a plane where first surface 201 is located (parallel to the XY plane) may be greater than the surface area of first surface 201.

In some embodiments, touch location identifier 205 may be arranged on first surface 201, and touch location identifier 205 indicates to the user where is the location for the user to operate or press. Therefore, the user can touch first surface 201 to move button 20 so as to dismount bracket 10 or storage device 1.

In some embodiments, as shown in FIG. 4, in a plane, parallel to the XY plane, where first surface 201 is located, the dimension of second surface 202 in the longitudinal axis LC (parallel to the Y direction) may be greater than the dimension thereof in the direction perpendicular to the longitudinal axis LC (parallel to the X direction). In this way, a more reasonable structure of button 20 may be provided according to the dimension of bracket 10.

In some embodiments, as shown in FIGS. 2 to 4, third surface 101 may be parallel to first surface 201, and fourth surface 102 may be an inclined surface or a curved surface. Providing the fourth surface as an inclined surface or a curved surface can simplify the manufacturing process of bracket 10 and reduce costs.

In some embodiments, second surface 202 and fourth surface 102 may be arranged at first end 211 along the longitudinal axis LC of bracket 10. A bracket and button structure with a more reasonable layout is provided.

According to an embodiment of the second aspect of the present disclosure, storage device 1 includes the apparatus according to the first aspect of the present disclosure and disk 30 coupled to bracket 10.

Button 20 provides storage device 1 with more space for a user to operate, and therefore, storage device 1 may prevent the user from accidentally touching buttons of other storage devices 1 when touching button 20 (e.g., dismounting a disk), thereby preventing data from being corrupted or lost.

According to an embodiment of the third aspect of the present disclosure, as shown in FIG. 1, a disk array includes rack 40 and N storage devices 1-1, 1-2, 1-3, . . . , 1-N (collectively or individually referred to as storage device 1), where N is a positive integer greater than 1. The plurality of storage devices include storage device 1 according to the second aspect of the present disclosure, and first surfaces 201 and second surfaces 202 of buttons 20 of adjacent storage devices are alternately arranged in arrangement direction X of the plurality of storage devices (as shown in FIGS. 1 and 5).

It should be understood that the structure and functions of the disk array as shown in FIG. 1 and/or FIG. 5 are for illustrative purposes only and are not to imply any limitation to the scope of the present disclosure.

Since button 20 of storage device 1 provides the user with more operation space, the user will not or will substantially not accidentally touch buttons of other storage devices 1 when touching button 20. In this way, storage device 1 of the disk array can be prevented from being dismounted due to accidental touch, and data can also be prevented from being corrupted or lost.

In particular, if first end 211 of button 20 is not provided with second surface 202 but only has first surface 201' (shown with a double-dotted line in FIG. 5), the width between adjacent buttons 20 or adjacent storage devices 1 in the X direction is D1. Under this condition, if width D1 is exceeded when the user operates button 20, the user will accidentally touch adjacent or other buttons 20. This will cause decoupling of other brackets 10 and storage devices 1, thereby resulting in data corruption or loss.

However, according to an embodiment of the present invention, first end 211 of button 20 is provided with second surface 202. Therefore, the width between adjacent buttons 20 or adjacent storage devices 1 in the X direction is D2, and D2 is greater than D1, thereby increasing the user's operable range. If the user touches button 20 within the larger width range D2, adjacent or other buttons 20 will not or will substantially not be touched. Therefore, the user can be prevented from dismounting other storage devices due to accidental touch.

Various embodiments of the present disclosure have been described above. The foregoing description is illustrative rather than exhaustive, and is not limited to the disclosed various embodiments. Numerous modifications and changes are apparent to those of ordinary skill in the art without departing from the scope and spirit of the illustrated various embodiments. The selection of terms as used herein is intended to best explain the principles and practical applications of the various embodiments or the technical improvements to technologies on the market, or to enable other persons of ordinary skill in the art to understand the embodiments disclosed here.

The invention claimed is:

1. An apparatus for arranging a disk, comprising:
   a bracket configured to be detachably coupled to a rack; and
   a button arranged in the bracket and configured to be movable under the action of an external force to decouple the bracket from the rack,
   wherein a first end of the button is configured to be operated by a user, and an end surface of the first end comprises a first surface and a second surface,
   wherein the first surface is parallel to an XY plane in a Cartesian coordinate system defined by an X-axis, a Y-axis, and a Z-axis,
   wherein the bracket has a longitudinal axis parallel to the Y-axis, and
   wherein the second surface extends in a direction of the X-axis from the first surface towards a second end, opposite to the first end, of the button.

2. The apparatus according to claim 1, wherein the first surface is a flat surface, and the second surface is an inclined surface or a curved surface.

3. The apparatus according to claim 2, wherein the surface area of the second surface is greater than that of the first surface.

4. The apparatus according to claim 2, wherein a touch location identifier is arranged on the first surface, and the first surface is adapted to be touched by the user so as to move the button.

5. The apparatus according to claim 2, wherein the bracket further comprises:
   a connecting end configured to connect the disk; and
   a lever configured to be detachably coupled to the rack, wherein the button is arranged at an operating end, opposite to the connecting end, of the bracket.

6. The apparatus according to claim 5, wherein the lever is pivotably mounted to the bracket via a rotating shaft and comprises a first hook portion and a first groove respectively arranged at two ends of the lever, and the first hook portion is detachably coupled to the rack; and
   the apparatus further comprises a trigger element pivotably mounted to the bracket via a pivot, and the trigger element comprises a pressing end coupled with the button and a locking end adapted to be coupled with the first groove, wherein the pressing end is configured to rotate the trigger element about the pivot in response to the movement of the button under the action of an external force, so as to decouple the locking end from the first groove, thereby allowing the first hook portion of the lever to disengage from the rack.

7. The apparatus according to claim 5, wherein an end surface of the operating end comprises a third surface and a fourth surface that extends from the third surface towards the connecting end.

8. The apparatus according to claim 7, wherein a ventilation hole is arranged on the third surface, and the ventilation hole is configured to allow the air to flow through so as to cool the disk, and at least capacity information of the disk is provided on the fourth surface.

9. The apparatus according to claim 8, wherein the third surface is parallel to the first surface, and the fourth surface is an inclined surface or a curved surface.

10. The apparatus of claim 1, wherein the bracket includes a connecting end configured to connect the disk to the bracket, and wherein the disk connected to the bracket extends in a direction of the Z-axis.

11. A storage device, comprising:
an apparatus which includes:
   a bracket configured to couple to and detach from a rack; and
   a button arranged in the bracket and configured to be movable under the action of an external force to decouple the bracket from the rack,
   wherein a first end of the button is configured to be operated by a user, and an end surface of the first end comprises a first surface and a second surface,
   wherein the first surface is parallel to an XY plane in a Cartesian coordinate system defined by an X-axis, a Y-axis, and a Z-axis,
   wherein the bracket has a longitudinal axis parallel to the Y-axis, and
   wherein the second surface extends in a direction of the X-axis from the first surface towards a second end, opposite to the first end, of the button; and
a disk which is coupled to the bracket and extends in a direction of the Z-axis.

12. A disk array, comprising:
a rack on which a plurality of storage devices including a particular storage device are arranged side by side,
wherein the particular storage device includes
   (i) an apparatus having:
      a bracket configured to be detachably coupled to a rack; and
      a button arranged in the bracket and configured to be movable under the action of an external force to decouple the bracket from the rack,
      wherein a first end of the button is configured to be operated by a user, and an end surface of the first end comprises a first surface and a second surface,
      wherein the first surface is parallel to an XY plane in a Cartesian coordinate system defined by an X-axis, a Y-axis, and a Z-axis,
      wherein the bracket has a longitudinal axis parallel to the Y-axis,
      wherein the second surface extends in a direction of the X-axis from the first surface towards a second end, opposite to the first end, of the button; and
   (ii) a disk which is coupled to the bracket,
      wherein adjacent storage devices from among the plurality of storage devices arranged side by side on the rack extend in a direction of the Z-axis, and
      wherein first surfaces and second surfaces of buttons of the adjacent storage devices are alternately arranged in the direction of the X axis.

* * * * *